United States Patent
Husain et al.

(10) Patent No.: US 7,226,514 B2
(45) Date of Patent: Jun. 5, 2007

(54) SPIN-RINSE-DRYER

(75) Inventors: Anwar Husain, Pleasanton, CA (US); Brian J. Brown, Palo Alto, CA (US); David G. Andeen, Los Gatos, CA (US); Svetlana Sherman, San Jose, CA (US); John M. White, Hayward, CA (US); Michael Sugarman, San Francisco, CA (US); Makoto Inagawa, Palo Alto, CA (US); Manoocher Birang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 375 days.

(21) Appl. No.: 10/309,832

(22) Filed: Dec. 4, 2002

(65) Prior Publication Data

US 2003/0079762 A1 May 1, 2003

Related U.S. Application Data

(62) Division of application No. 09/544,660, filed on Apr. 6, 2000, now Pat. No. 6,516,816.
(60) Provisional application No. 60/128,257, filed on Apr. 8, 1999.

(51) Int. Cl.
*B08B 3/02* (2006.01)

(52) U.S. Cl. ............... 134/33; 134/34; 134/42; 134/182

(58) Field of Classification Search ......... 134/94.1, 134/95.2, 102.1, 140, 153, 157, 902; 34/58, 34/187, 312, 317, 313, 314, 315, 316, 318, 34/319, 320, 321, 322, 323, 324, 325, 326, 34/327, 328; 118/58, 59, 52

See application file for complete search history.

(56) References Cited

U.S. PATENT DOCUMENTS 3,865,298 A    2/1975   Allen et al.

(Continued)

FOREIGN PATENT DOCUMENTS

EP    0 795 892 A1    9/1997

(Continued)

OTHER PUBLICATIONS

Europena Patent Office 0 795 892 Sep. 1997.*

*Primary Examiner*—Frankie L. Stinson
(74) *Attorney, Agent, or Firm*—Dugan and Dugan

(57) ABSTRACT

An inventive vertical spin-dryer is provided. The inventive spin-dryer may have a shield system positioned to receive fluid displaced from a substrate vertically positioned within the spin-dryer. The shield system may have one or more shields positioned to at least partially reflect fluid therefrom as the fluid impacts the shield. The one or more shields are angled to encourage the flow of fluid therealong, and are preferably hydrophilic to prevent droplets from forming. Preferably the shield system has three shields positioned in a horizontally and vertically staggered manner so that fluid is transferred from a substrate facing surface of a first shield to the top or non-substrate-facing surface of an adjacent shield, etc. A pressure gradient may be applied across the interior of the spin-dryer to create an air flow which encourages fluid to travel along the shield system in a desired direction. A sensor adapted to facilitate desired flywheel position, an openable gripper having a remote actuator, a radiused gripper and a source of inert drying gas are also provided in individual embodiments.

17 Claims, 9 Drawing Sheets

U.S. PATENT DOCUMENTS

| | | | |
|---|---|---|---|
| 3,970,471 A | | 7/1976 | Bankes et al. |
| 3,993,018 A | * | 11/1976 | Kranik et al. ............... 118/52 |
| 4,033,288 A | * | 7/1977 | Woellhaf et al. ............ 118/52 |
| 4,161,356 A | * | 7/1979 | Giffin et al. |
| 4,385,587 A | * | 5/1983 | James et al. ............... 118/50 |
| 4,544,446 A | * | 10/1985 | Cady |
| 4,674,521 A | | 6/1987 | Paulfus |
| 4,694,527 A | | 9/1987 | Yoshizawa |
| 4,745,422 A | * | 5/1988 | Matsuoka et al. |
| 4,871,417 A | * | 10/1989 | Nishizawa et al. ......... 438/748 |
| 4,982,753 A | * | 1/1991 | Grebinski, Jr. et al. |
| 5,022,419 A | * | 6/1991 | Thompson et al. |
| 5,174,045 A | * | 12/1992 | Thompson et al. ............ 34/58 |
| 5,317,778 A | | 6/1994 | Kudo et al. |
| 5,340,437 A | * | 8/1994 | Erk et al. |
| 5,357,645 A | * | 10/1994 | Onodera |
| 5,435,075 A | * | 7/1995 | Shiraishi et al. ............ 34/58 |
| 5,468,302 A | * | 11/1995 | Thietje ...................... 134/1 |
| 5,624,501 A | * | 4/1997 | Gill, Jr. ...................... 134/6 |
| 5,727,332 A | | 3/1998 | Thrasher et al. |
| 5,745,946 A | | 5/1998 | Thrasher et al. |
| 5,778,911 A | | 7/1998 | Yoshio |
| 5,810,028 A | | 9/1998 | Ichikawa et al. |
| 5,846,327 A | | 12/1998 | Kamamoto et al. |
| 5,860,178 A | | 1/1999 | Nishimura et al. |
| 5,927,303 A | * | 7/1999 | Miya et al. |
| 5,927,305 A | | 7/1999 | Shiba |
| 5,974,680 A | | 11/1999 | Anderson et al. |
| 6,019,843 A | * | 2/2000 | Park et al. |
| 6,082,377 A | * | 7/2000 | Frey |
| 6,114,254 A | | 9/2000 | Rolfson |
| 6,125,551 A | * | 10/2000 | Bushong et al. ............. 34/318 |
| 6,125,863 A | * | 10/2000 | Bexten |
| 6,230,753 B1 | * | 5/2001 | Jones et al. ................ 134/1.3 |
| 6,258,220 B1 | | 7/2001 | Dordi et al. |
| 6,269,548 B1 | * | 8/2001 | Shinozaki et al. |
| 6,269,552 B1 | * | 8/2001 | Honda et al. ................. 34/317 |
| 6,273,104 B1 | * | 8/2001 | Shinbara et al. |
| 6,286,524 B1 | * | 9/2001 | Okuchi et al. ............. 134/95.2 |
| 2002/0121341 A1 | * | 9/2002 | Tanaka et al. ......... 156/345.21 |

FOREIGN PATENT DOCUMENTS

| | | | |
|---|---|---|---|
| EP | 0 976 460 A1 | | 2/2000 |
| EP | 1 069 598 | | 1/2001 |
| GB | 2325782 | | 12/1998 |
| JP | 58-9325 | * | 1/1983 |
| JP | 58-203630 | | 11/1983 |
| JP | 59-121839 | * | 7/1984 |
| JP | 60-245136 | * | 12/1985 |
| JP | 1-259536 | * | 10/1989 |
| JP | 2-253620 | | 10/1990 |
| JP | 3-62521 | | 3/1991 |
| JP | 3-62925 | | 3/1991 |
| JP | 3-124026 | | 5/1991 |
| JP | 3-218016 | * | 9/1991 |
| JP | 4-719 | | 1/1992 |
| JP | 4-150027 | | 5/1992 |
| JP | 5-36664 | | 6/1993 |
| JP | 5-152269 | * | 6/1993 |
| JP | 5-152273 | | 6/1993 |
| JP | 6-196465 | * | 7/1994 |
| JP | 8-254695 | * | 10/1996 |
| JP | 9-152720 | * | 6/1997 |
| JP | 10-34054 | * | 2/1998 |
| JP | 2001007068 | | 12/2001 |
| WO | WO 00/42637 | | 7/2000 |
| WO | WO 01/46998 A1 | | 6/2001 |

* cited by examiner

SPIN-RINSE-DRYER

This application is a division of U.S. patent application Ser. No. 09/544,660, filed Apr. 6, 2000 now U.S. Pat. No. 6,516,816, which claims priority from U.S. provisional application Ser. No. 60/128,257, filed Apr. 8, 1999, both of which are hereby incorporated by reference herein in their entirety.

FIELD OF THE INVENTION

The present invention relates to the cleaning and drying of thin disks such as glass substrates, flat panel displays, patterned or unpatterned semiconductor substrates and the like. More specifically, the present invention relates to an improved spin-rinse-dryer for rinsing and drying semiconductor substrates.

BACKGROUND OF THE INVENTION

As semiconductor device geometries continue to decrease, the importance of ultra clean processing increases. Aqueous cleaning within a tank of fluid (or a bath) followed by a rinsing process (e.g., by submersing the substrate in rinsing fluid, or by spraying the substrate with rinsing fluid) achieves desirable cleanliness levels. However, after rinsing is complete, absent use of a drying apparatus, the rinsing fluid would evaporate from the substrate's surface causing streaking, spotting and/or leaving bath residue on the surface of the substrate. Such streaking, spotting and residue can cause subsequent device failure. Accordingly, much attention has been directed to improved methods for drying a substrate after a final rinsing step.

In addition to providing streak-free drying, such methods should be capable of quickly drying the substrate so as to increase throughput, and should not present a bottleneck for the overall substrate processing system.

Accordingly, a need exists for a method and apparatus that quickly and reliably rinses and dries a substrate such as a semiconductor substrate.

SUMMARY OF THE INVENTION

The present invention provides an improved spin-rinse-drier (SRD) comprising a substrate support for holding and rotating a vertically oriented substrate; a source of fluid adapted to supply fluid preferably to both surfaces of a substrate positioned on the substrate support; and, in a first aspect, at least a first shield designed to remove rinsing fluid from the vicinity of the substrate, and particularly to remove rinsing fluid from areas which may allow droplets to fall onto a substrate positioned therebelow. Accordingly, in the first aspect the shield is positioned to receive fluid displaced from a substrate rotating on the substrate support, and is adapted to reflect the received fluid away from the substrate. In a second aspect, a shield is positioned to receive fluid displaced from a substrate rotating on the substrate support, and comprises a hydrophilic substrate facing surface. The entire substrate facing surface of the shield may be hydrophilic, or a hydrophilic wafer facing surface may be mounted (e.g., in the region above the substrate) to a non-hydrophilic shield. In a third aspect, the inventive SRD comprises a shield system having a plurality of vertically and horizontally staggered shields positioned to receive fluid displaced from a substrate rotating on the substrate support, and adapted to carry fluid away from the area above the substrate. As used herein, a shield or shield system described as vertically staggered, or as having various elevations and slopes, refers to the upper region of the shield. It will be understood that the sides and lower regions of the shield may have other shapes.

Further aspects of the invention comprise various combinations of the aspects described above, and/or may comprise further advantageous features. For example, the inventive SRD may have a pressure gradient applied to induce laminar airflow across the surface of the substrate to enhance drying. The plurality of shields can be positioned to further direct the airflow toward the substrate, and may have close vertical spacing such that the airflow enhances the movement of fluid along the shields in a desired direction. The lid of the inventive SRD may be hydrophilic (to enhance fluid sheeting rather than droplet formation) and/or may be sloped to encourage fluid flow in a desired direction. Yet further aspects comprise a sensor and flag adapted to sense a desired position of the flywheel, comprise applying rinsing fluid to the substrate while rotating the substrate at a speed of at least 400 revolutions per minute, comprise a plurality of openable grippers that are biased to a closed position, and have remote pins adapted to selectively open the grippers, grippers that have a hole or slot located at a point of contact between the gripper and a substrate and/or comprise radiused grippers preferably radiused in a plurality of directions.

Other features and advantages of the present invention will become more fully apparent from the following detailed description of the preferred embodiments, the appended claims and the accompanying drawings.

BRIEF DESCRIPTION OF THE PREFERRED EMBODIMENTS

DETAILED DESCRIPTION OF THE PREFERRED EMBODIMENTS

Figure 1A:
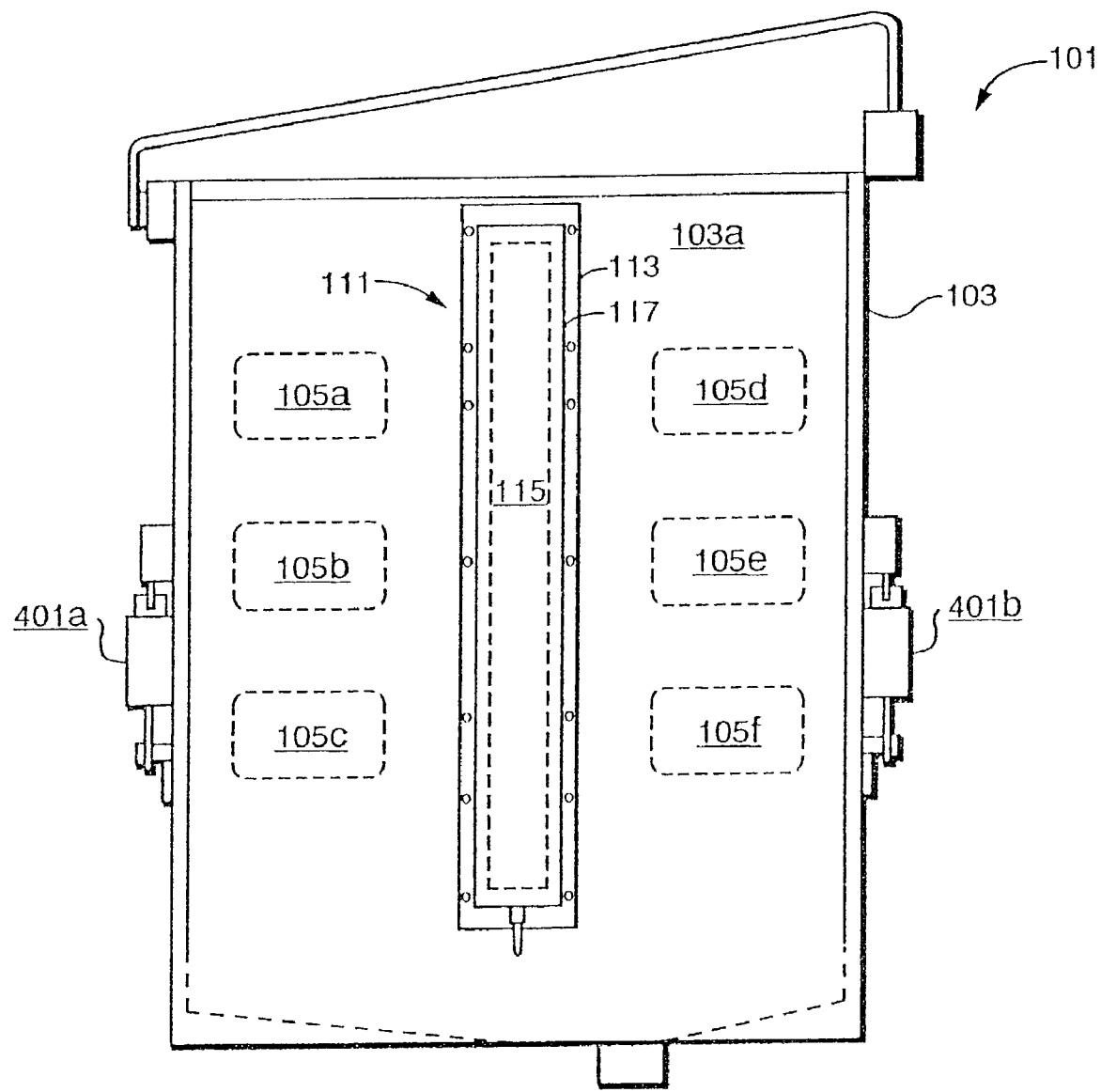
FIGS. 1A and 1B are a perspective view of the frontside and the backside, respectively, of an inventive SRD.

For convenience, throughout the drawings, the left-most digit of a reference number identifies the drawing in which the reference number first appears.

Figure 1B:
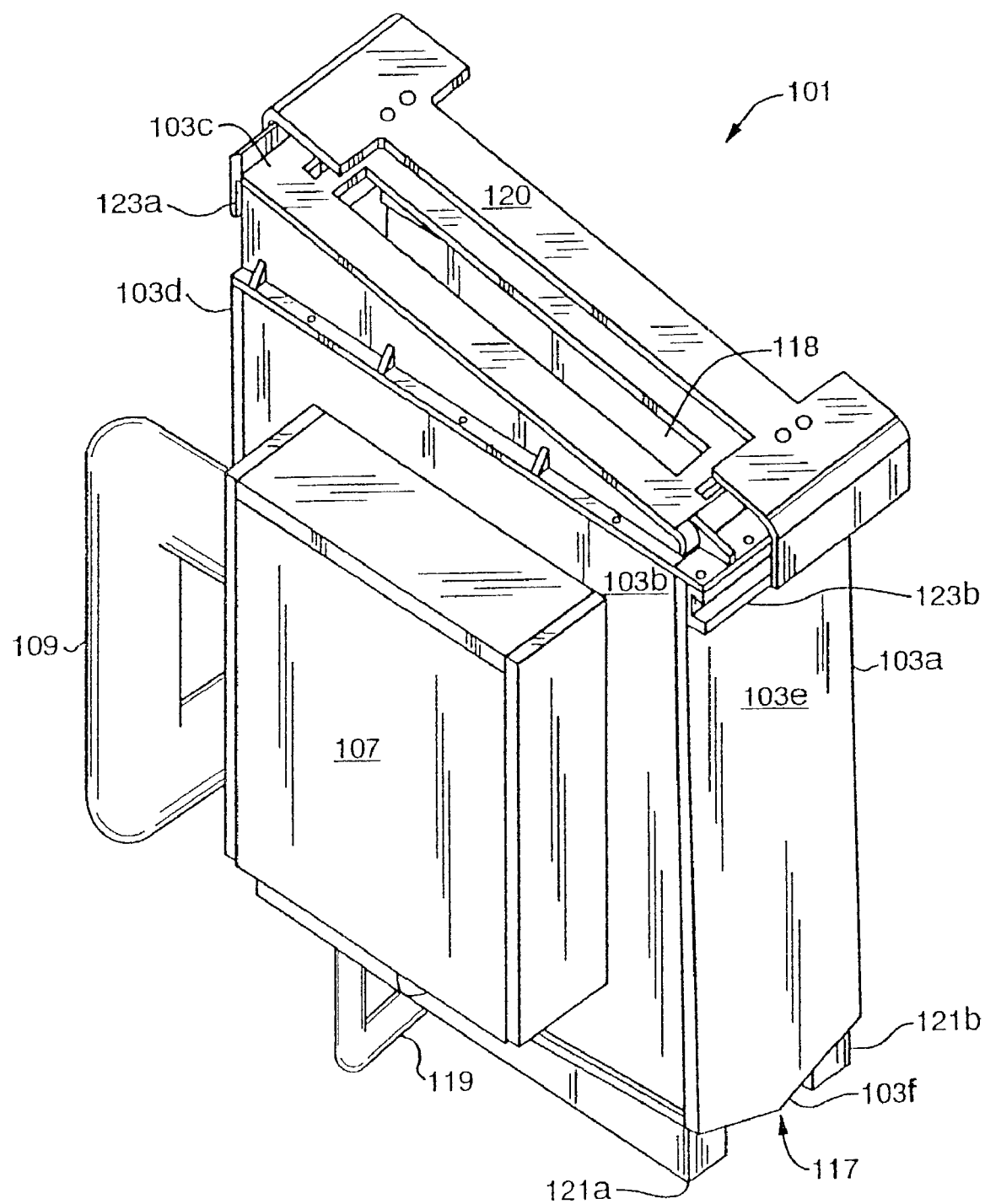

FIGS. 1A and 1B are a front and back perspective view, respectively, of an inventive SRD 101 for rinsing, spinning and drying a vertically oriented thin disk such as a semiconductor substrate. The SRD 101 comprises a housing 103; a front side 103a of the housing 103 has a plurality of openings or vents 105a–f that allow clean air to enter the housing 103. A plenum 107 is positioned along a backside 103b of the housing 103. The plenum 107 is exhausted via an exhaust line 109, which is coupled to a pump (not shown). A top 103c of the housing 103 is bolted to the side walls of the housing 103 so that the top 103c may be removed therefrom should the SRD 101's internal components need servicing. The top 103c of the SRD housing 103 slopes from a first side wall 103d to a second side wall 103e so that any fluid which collects on the top 103c will flow to the lower side thereof, and down the second sidewall 103e. A heat lamp assembly 111 comprises a housing 113 mounted to the front side 103a of the SRD housing 103, a heat lamp 115 contained within the housing 113, and a quartz shield 117. The quartz shield 117 comprises a portion of the front side 103a of the SRD housing 103 which is made of quartz so as to allow the transmission of light from the heat lamp 115 to a substrate 201 (see FIG. 2). The heat lamp assembly 111 extends the length of the substrate 201's diameter such that the entire substrate 201 is heated thereby as the substrate 201 rotates.

The top 103c of the SRD housing 103 has an opening 118 sized to allow substrate insertion and extraction. A slideable door 120 is mounted on a pair of tracks 123a, 123b so as to slide back and forth to open and close the opening 111. A bottom wall 103f of the SRD housing slopes to a low point 117. A drain 119 is coupled to the bottom wall 103f at the low point 117 to remove rinsing fluid therefrom. A pair of legs 121a, 121b coupled to the SRD housing's bottom wall 103f support the SRD 101. The internal components of the inventive SRD 101 are described with reference to FIG. 2.

Figure 2:
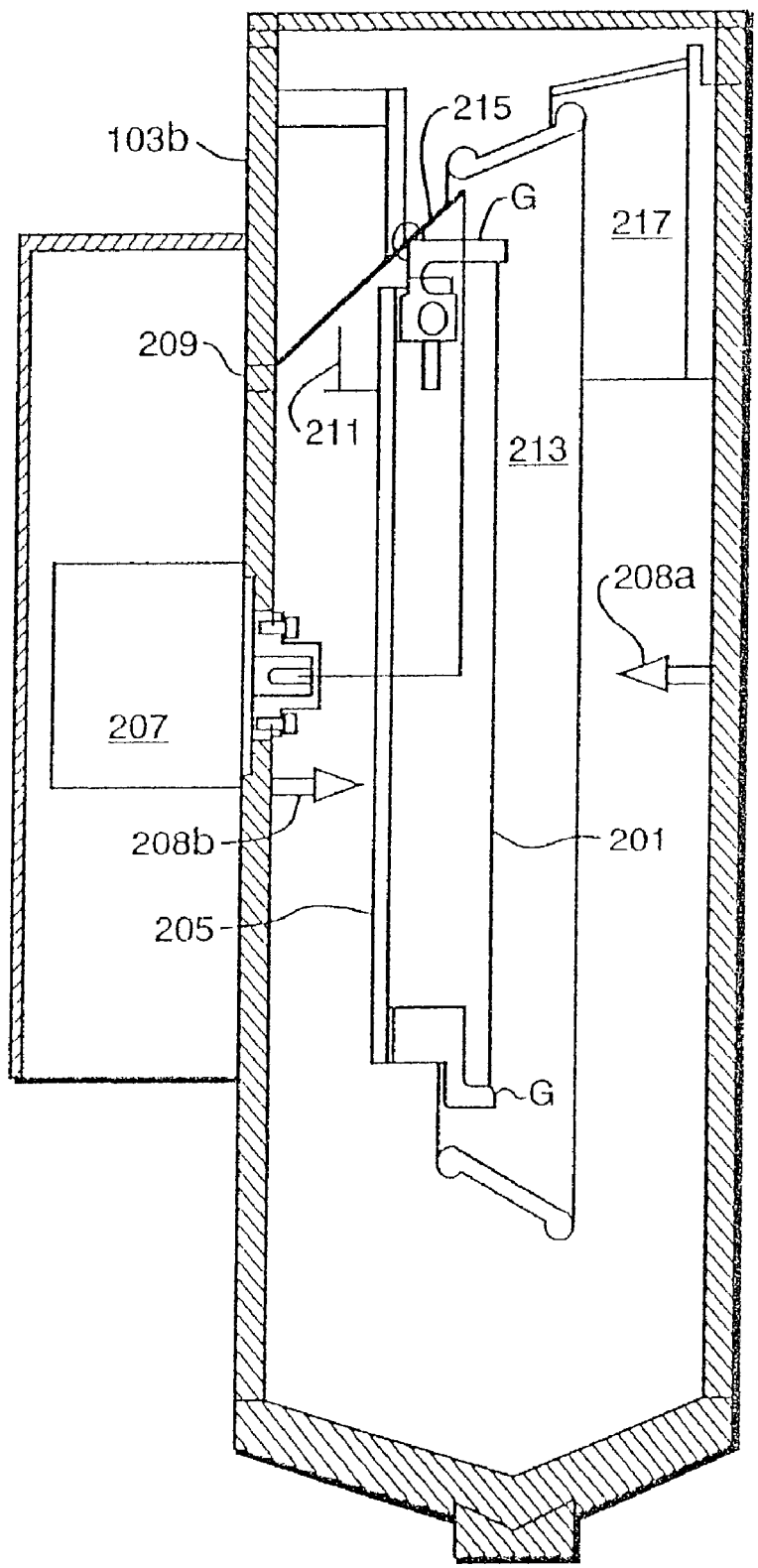
FIG. 2 is a side cross-sectional view of the inventive SRD of FIG. 1.

FIG. 2 is a side cross-sectional view showing pertinent parts of the inventive SRD 101 of FIG. 1. Within the inventive SRD 101 a substrate 201 is shown supported by a pair of grippers G which extend from a rotateable flywheel 205. Additional grippers (referenced as 403a–c and 405a–b) can be seen with reference to FIG. 4. The flywheel 205 is coupled to a motor 207 via an opening in the backside 103b of the SRD housing. A pair of rinsing fluid nozzles 208a, 208b are coupled to a source of rinsing fluid (not shown), and are positioned to supply rinsing fluid to the center of the front and back surfaces of the substrate 201, respectfully. A proximity sensor 209 (e.g., a capacitive or inductive based proximity sensor) protrudes through the backside 103b of the SRD housing so as to detect the presence of a metal flag 211 mounted to the flywheel 205. A shield system comprising a main shield 213, a lower shield 215, and a higher shield 217 surrounds the substrate 201 and is shown separately in FIG. 3 and described further with reference thereto.

Figure 3:
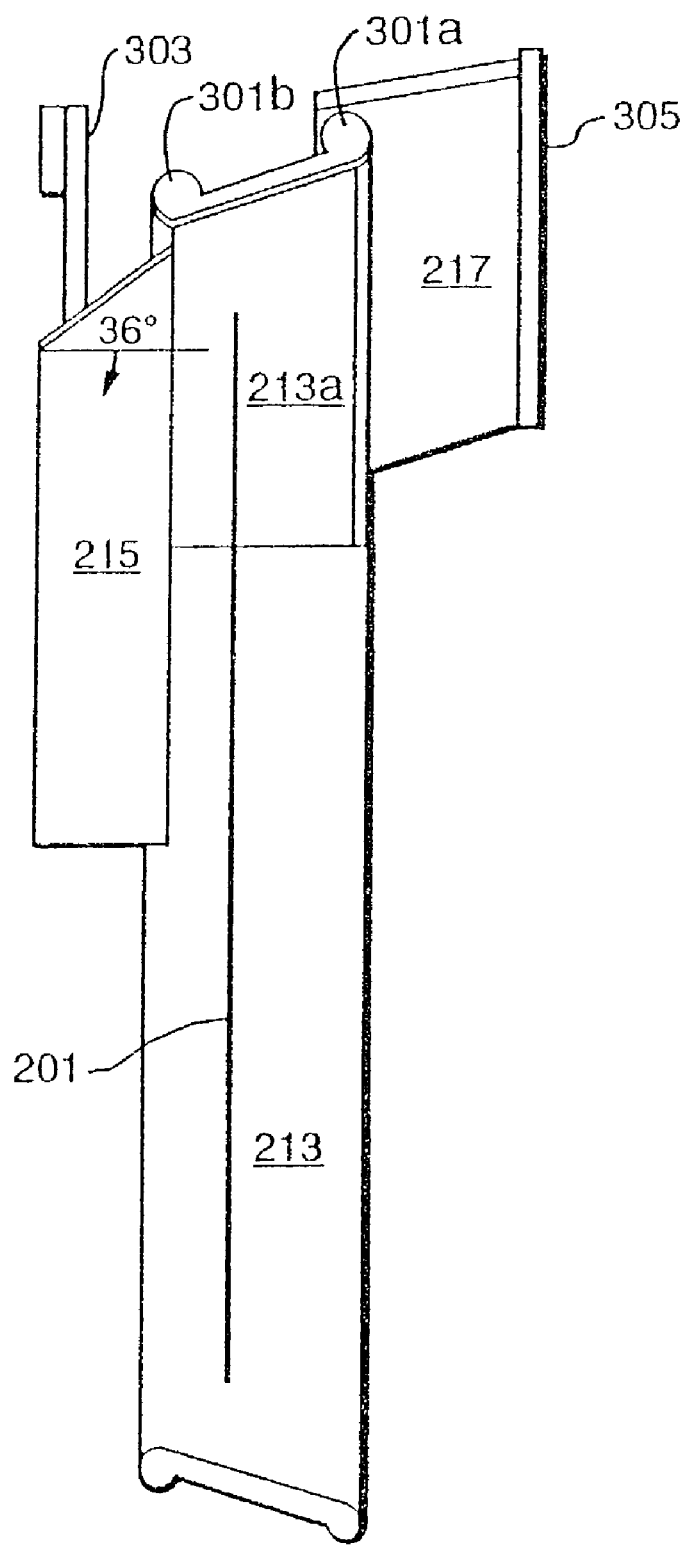
FIG. 3 is a side cross-sectional view of the shield system of the inventive SRD of FIG. 1.

FIG. 3 is a side cross-sectional view of the shield system of the inventive SRD of FIG. 1. The preferred main shield 213 can be described as a slice of a cone which surrounds the entire perimeter of the substrate 201 positioned on the flywheel 205 (FIG. 2). Thus, the main shield 213 slants from a larger diameter to a smaller diameter which is closest to the flywheel 205 (FIG. 2). These diameters preferably are selected such that the substrate facing surface of the main shield 213 has an angle in the range of 5° to 45°, (from normal) and most preferably 18°. The substrate facing surface of the main shield 213 preferably is smooth and hydrophilic, such that fluid displaced from the substrate 201 which strikes the substrate facing surface of the main shield 213 reflects therefrom and/or flows therealong preventing droplets from forming and dripping on the substrate 201. Because hydrophilic materials (e.g., quartz) are expensive a non-hydrophilic shield (e.g., a plastic shield) maybe employed, and a hydrophilic material such as quartz mounted inside a desired portion of the non-hydrophilic shield so as to form a hydrophilic wafer facing surface or liner. For example, a quartz liner 213a may be employed in the region above the substrate (e.g., in the upper half of the main shield 213), as shown in FIG. 3. The substrate facing surface and the outer surface of the main shield 213 are parallel in the preferred embodiment such that the outer surface and the substrate facing surface share a common slope. The outer surface of the main shield 213 preferably has a raised region 301a, 301b along both edges to prevent rinsing fluid from running over the respective edge of the main shield 213's top outer surface and onto the substrate 201 positioned therebelow.

Figure 4:
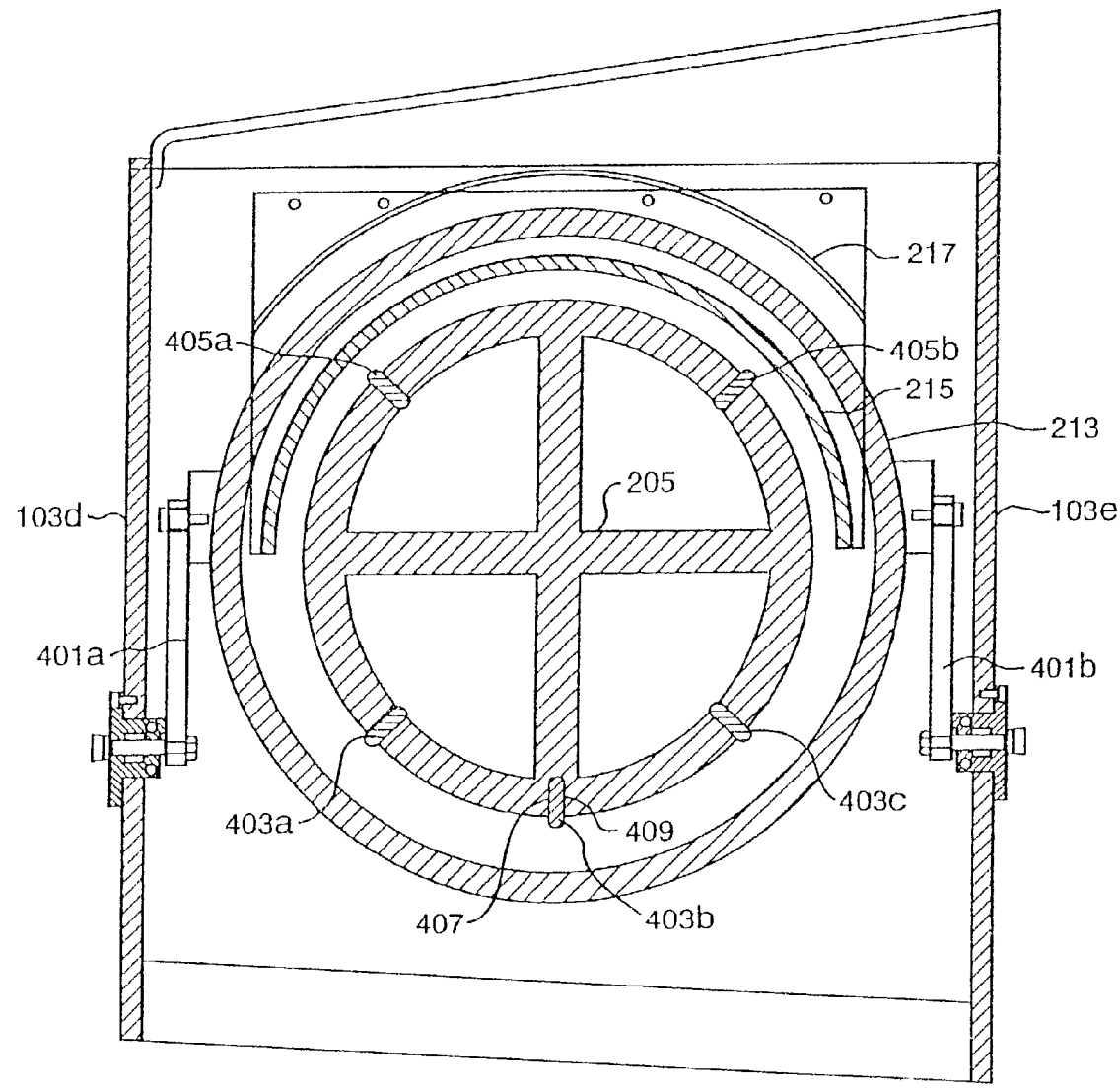
FIG. 4 is a front cross-sectional view of the inventive SRD of FIG. 1.

Because the main shield 213 surrounds the substrate 201, the main shield 213 is coupled to the first sidewall 103d (FIG. 1) and to the second sidewall 103e (FIG. 2) of the SRD housing via a pair of pneumatically driven links 401a, 401b (FIG. 4). Thus the main shield 213 moves away from the grippers G (FIG. 2) to enable substrate 201 insertion and extraction. The main shield 213 may move uniformly forward away from the grippers G, or the top region of the main shield 213 may tilt forward sufficiently to enable insertion and extraction of the substrate 201.

Referring again to FIG. 3, the preferred lower shield 215 also may be described as a cone-shaped slice, which surrounds the upper half of the substrate 201's perimeter. The lower shield 215 slants from a larger radius to a smaller radius which is closest to the flywheel 205 (FIG. 2). These radii are selected such that the substrate facing surface of the lower shield 215 has an angle in the range of 5 to 45°, and most preferably 36°, so that rinsing fluid flows therealong away from the substrate 201. The substrate facing surface and the outer surface of the lower shield 215 also are parallel in the preferred embodiment. The lower shield 215 is coupled to the backside 103b of the SRD housing via a bracket 303.

Like the main shield 213 and the lower shield 215, the higher shield 217 may be described as a cone-shaped slice, which surrounds the upper quarter of the substrate 201's perimeter. The higher shield 217 slants from a larger radius to a smaller radius which is closest to the flywheel 205 (FIG. 2). These radii are selected such that the substrate facing surface of the higher shield 217 has an angle in the range of 5 to 45°, and most preferably 10°, so that rinsing fluid flows therealong toward the main shield 213 (as further described below). The higher shield 217 is coupled to the front side 103a (FIG. 1) of the SRD housing via a bracket 305.

The main shield 213, the lower shield 215-and the higher shield 217 are arranged in a vertically and horizontally staggered manner to receive fluid displaced from the flywheel 205 (FIG. 2) as the flywheel 205 rotates, and are adapted to carry fluid away from the region above the substrate 201. In the preferred embodiment, the lower elevation (or smaller diameter) edge of the higher shield 217 overlaps the higher elevation (or larger diameter) edge of the main shield 213, and the lower elevation edge of the main shield 213 overlaps the higher elevation edge of the lower shield 215, as shown. The edges of the adjacent shields are closely spaced vertically (e.g., 0.3 inches) so that in the regions above the substrate 201, fluid flows from the substrate facing surface of the higher elevation shield to the outer surface of the nearest lower elevation shield with minimal splashing. The close vertical spacing of the shields 213, 215 and 217 also facilitates transfer of fluid along the shield system (as further described below with respect to the overall operation of the inventive SRD 101). Although the preferred higher and lower shields extend around only the top portion of the substrate, either or both can extend to surround any portion of, or the entire perimeter of the substrate. Such extension will facilitate air flow around the entire perimeter of the substrate, and prevent turbulence.

Similarly, the main shield 213 can provide desired fluid flow and fluid reflection when extending along only the upper portion of the substrate 201.

FIG. 4 is a front cross-sectional view of the inventive SRD of FIG. 1. A plurality of grippers ("G" of FIG. 2) which support the substrate 201 comprise three fixed grippers 403a–c and two moveable grippers 405a–b. The fixed grippers 403a–c and the moveable grippers 405a–b are coupled to the flywheel 205. Each of the grippers 403a–c, 405a–b comprises an end effector 407 and a finger portion 409. The finger portions 409 are configured for either stationary or moveable coupling to the flywheel 205, as described with reference to FIGS. 6A and 6B. The end effector 407 of both the fixed grippers 403a–c and the moveable grippers 405 are configured so as to support the substrate 201 with minimal contact and so as to avoid trapping fluid against the substrate 201. The configuration of the end effector 407 is best understood with reference to FIGS. 5A and 5B.

Figure 5A:
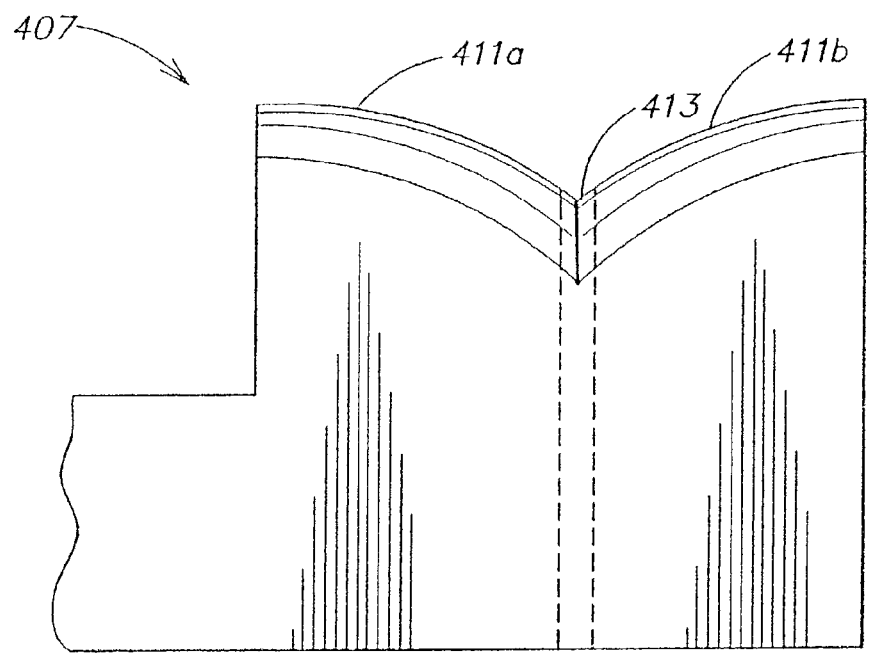
FIGS. 5A and 5B are a side view and a front view, respectively, of the gripper end effectors of the inventive SRD of FIG. 1.
Figure 5B:
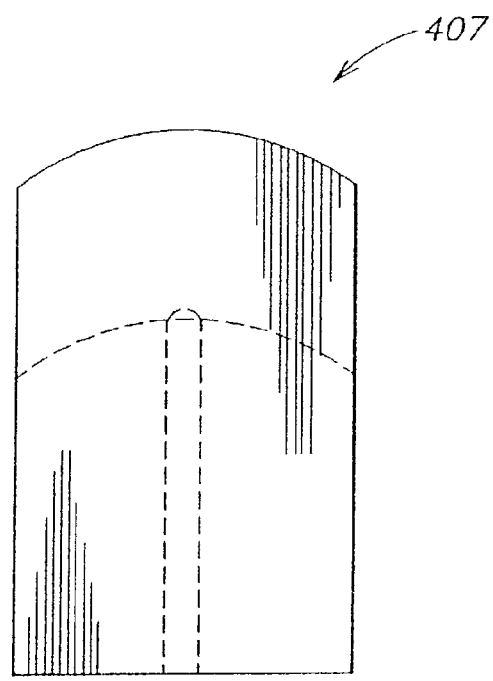
Figure 5C:
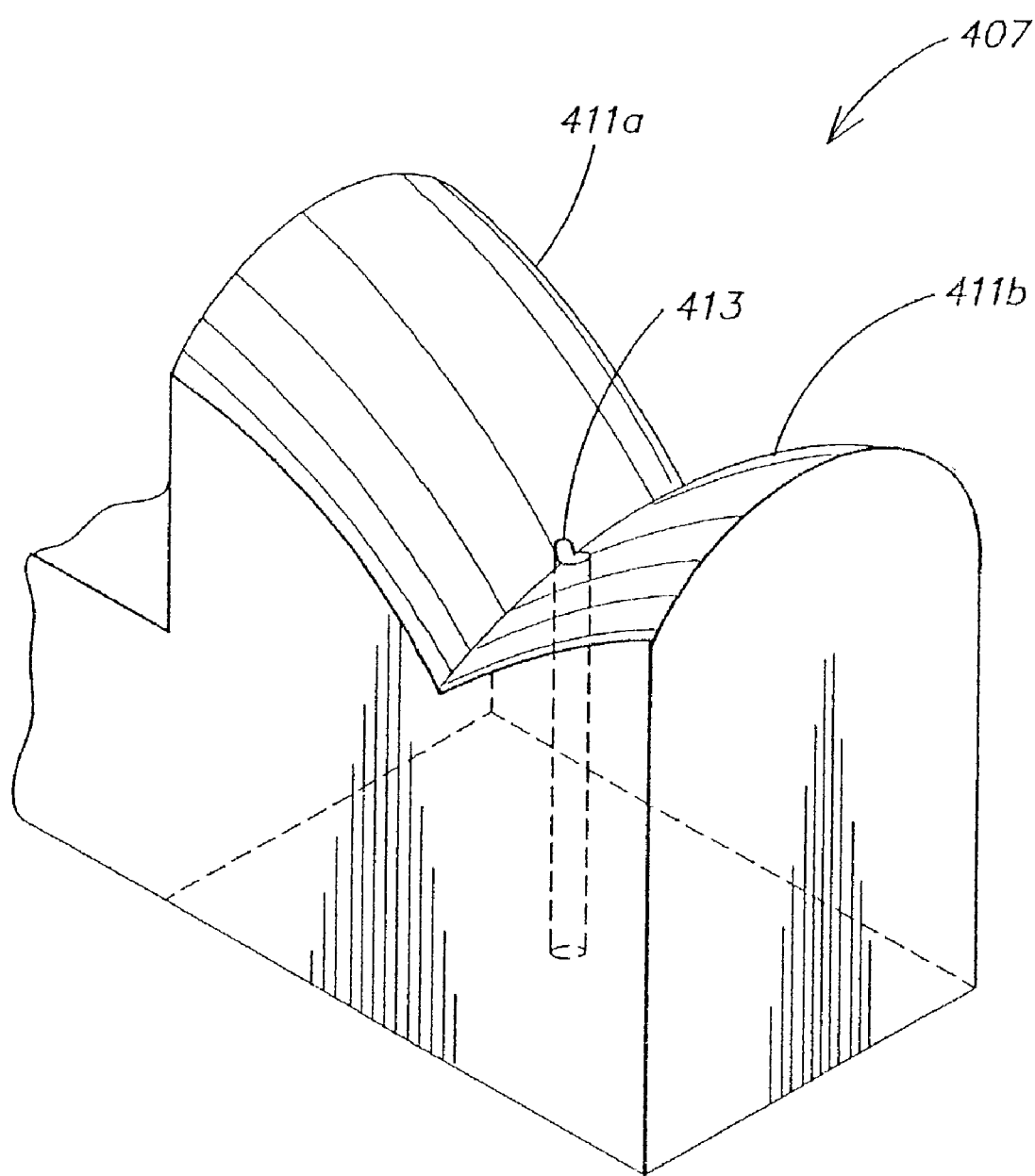
FIG. 5C is a perspective view of the end effector 407.

FIGS. 5A and 5B are a side view and a front view, respectively, of the end effector 407 of the inventive SRD 101. FIG. 5C is a perspective view of the end effector 407. The end effector 407 is comprised of two tip regions 411a, 411b, which join forming a valley, adapted to support the substrate 201 with minimal contact. A slot or hole 413 may be located in the region where the tip regions 411a, 411b join, such that fluid may flow through the hole 413, away from the substrate 201.

The fixed grippers 403a–c are spaced along the bottom of the flywheel 205 so as to support the substrate 201 in a fixed position both horizontally and vertically, when a substrate is lowered thereto. The tip regions 411a, 411b are radiused both in the longitudinal direction (between the finger portion 409 and the substrate 201) and in the lateral direction (into and out of the page with reference to FIG. 5A), as shown in FIGS. 5A and 5B, respectively. The surfaces of the tip regions 411a, 411b are smooth, and preferably hydrophilic. Thus as the flywheel 205 rotates, fluid flows along the smooth radial surfaces of the tip regions 411a, 411b and does not remain in contact with the substrate 201. Ideally, the plurality of grippers 403a–c, 405a–b are positioned such that the center of the substrate 201 supported thereby is below the center of the flywheel 205 (e.g., 0.1–3 mm below and most preferably 1 mm below the flywheel's center) in the direction of the fixed grippers 403a–c. In this manner, as the substrate 201 rotates the substrate 201 is forced toward the fixed grippers 403a–c. Because the fixed grippers 403a–c do not open, the substrate 201 is unlikely to become unseated as the flywheel 205 rotates.

Figure 6A:
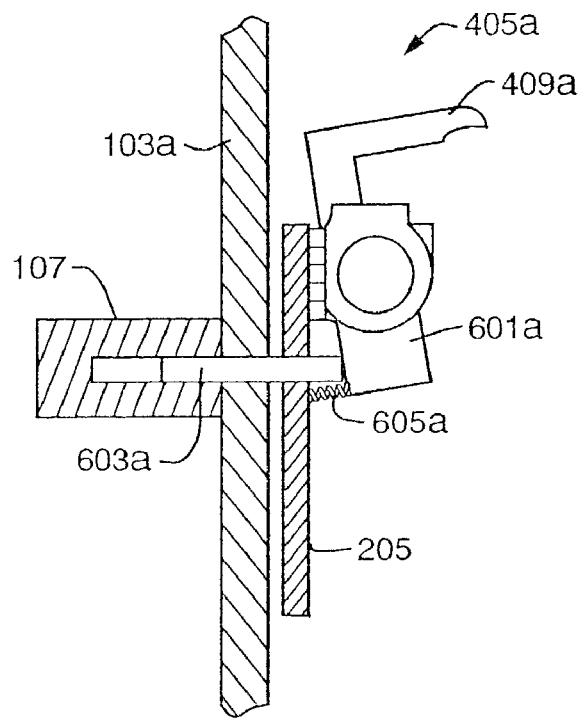
FIGS. 6A and 6B are side views of the grippers of FIGS. 5A–C, respectively showing the grippers in an open and a closed position.
Figure 6B:
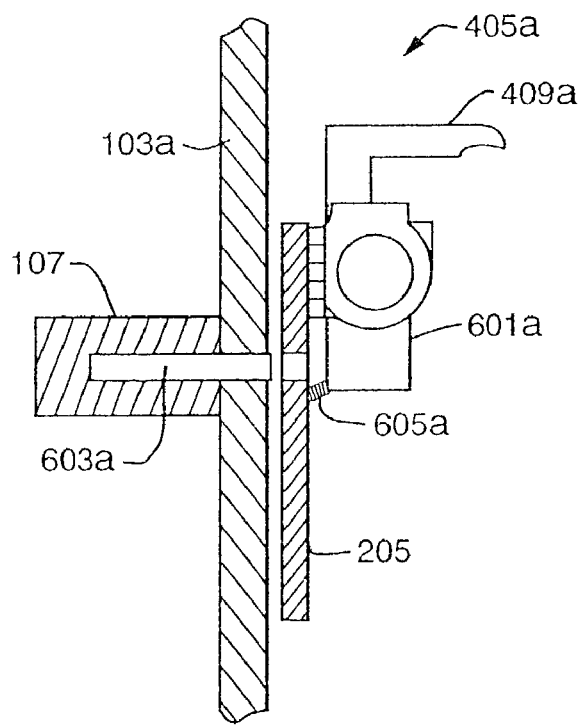

FIGS. 6A and 6B are side perspective views of the moveable grippers 405a, 405b in an open position and in a closed position, respectively. Each of the moveable grippers 405a, 405b, respectively, comprises a base portion 601a, 601b. To open the moveable grippers 405a, 405b a pneumatically driven pin 603a, 603b, respectively, contacts the base portion 601a, 601b of the moveable grippers 405a, 405b, pushing the base portion 601a, 601b forward (toward the frontwall 103a of the SRD housing), and thus causing the finger portion 409a, 409b to move backward as shown in FIG. 6A. The pneumatic actuator (not shown) for the pins 603a, 603b is housed within the plenum 107, and the pins 603a, 603b slide through openings (not shown) in the backside 103b of the SRD housing in order to contact the base portion 601a, 601b of the moveable grippers 405a, 405b. A pair of springs 605a, 605b bias the moveable grippers 405a, 405b in a closed position (FIG. 6B) absent the pins 603a, 603b contact with the base portion 601a, 601b of the moveable grippers 405a, 405b, respectively.

Figure 7A:
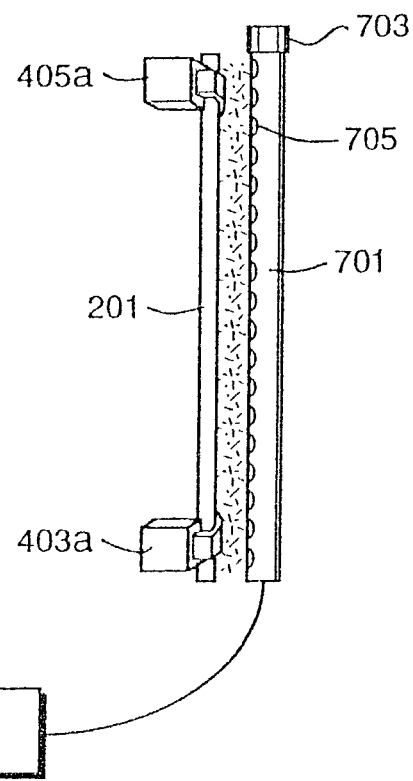
FIGS. 7A and 7B are a side and a front cross sectional view, respectively, showing an optional drying mechanism employed within the inventive SRD of FIG. 1.
Figure 7B:
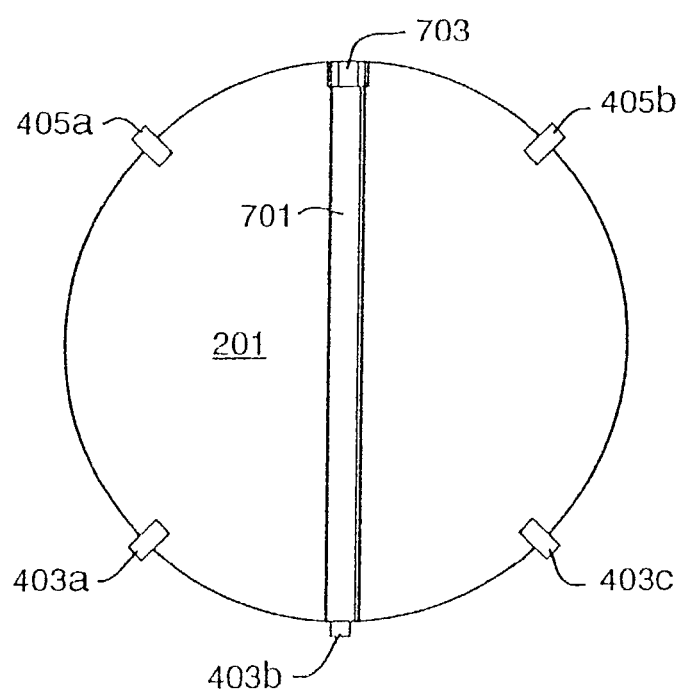

FIGS. 7A and 7B are a side and a front cross sectional view, respectively, showing an optional drying mechanism employed within the inventive SRD of FIG. 1. As shown in FIGS. 7A and 7B, the optional drying mechanism comprises a Teflon tube 701 which extends preferably along the vertical diameter of the substrate 201. A first end of the Teflon tube 701 is coupled to a source 702 of semiconductor grade clean dry inert gas (e.g., nitrogen, $CO_2$, AR, HE etc.), and a second end of the Teflon tube 701 has a cap 703, or is otherwise sealed, to prevent gas flow therethrough. The Teflon tube 701 is mounted in close proximity to the front surface of the substrate 201. A plurality of holes 705 exist in the face of the Teflon tube 701 which faces the substrate 201. The Teflon tube 701 or any similar drying mechanism is preferably configured to be unobtrusive in size so as not to block the majority of the substrate 201's surface from contact with the flow of air being pulled in through the vents 105a–f and being drawn across the surface of the substrate 201 via the plenum 107, and so as not to block the movement of the main shield 213 (e.g., the Teflon tube 701 is mounted to the frontwall). The number and the spacing between the plurality of holes 705, the flow rate of inert gas, and the spacing between the Teflon tube 701 and the substrate 201 is selected such that smooth low-flow laminar stream of inert gas assists in blowing and/or evaporating fluid from the surface of the substrate 201. Because fluid may be more difficult to remove from the edge of the substrate 210, the spacing between the holes 705 decreases in the area of the Teflon tube 701 which corresponds to the edge of the substrate 201. Although a thin tube shaped drying mechanism is preferred, other shapes may be employed (showerheads, square, rectangular, etc.). Similarly, the drying mechanism may be any size (e.g., equal in area to the substrate to be dried, etc.)

In operation, to rinse and dry a substrate 201, the slideable door 120 slides along the tracks 123a, 123b to an open position wherein the opening 118 is exposed, as shown in FIGS. 1A and 1B. The flywheel 205 is in a predetermined position wherein the proximity sensor 209 detects the metal flag 211 such that the base portions 601a, 601b of the moveable grippers 405a, 405b are aligned in front of the pins 603a, 603b. The pins 603a, 603b are driven forward and contact the moveable gripper's base portions 601a, 601b to open the moveable grippers 405a, 405b as shown in FIG. 6A, while the links 401a, 401b move forward carrying the main shield 213 forward such that it no longer surrounds the grippers 403a–c, 405a–b. A substrate handler (not shown) lowers the substrate 201 through the opening 111 and places the substrate 201 on the fixed grippers 403a–c. The fixed grippers 403a–c support the substrate 201 in a fixed position with the center of the substrate 201 below the center of the flywheel 205. A pneumatic actuator (not shown) gradually retracts the pins 603a, 603b such that the moveable grippers 405a, 405b gradually close, placing the tip regions 411a, 411b (FIGS. 4 and 5) in contact with the substrate 201, as the door 121 slides to a closed position.

Thereafter, the flywheel 205 begins to rotate. Because the substrate 201's center is offset from the center of the flywheel 205 in the direction of the fixed grippers 403a–c, rotation forces the substrate 201 firmly in the direction of the fixed grippers 403a–c. Accordingly, minimal force is experienced by the moveable grippers 405a, 405b and the substrate 201 is unlikely to become unseated from the grippers 403a–c, 405a–b.

The flywheel 205 initially rotates at a slow speed (e.g., 100 to 500 revolutions per minute (rpm)) while the rinsing fluid nozzles 208a, 208b supply rinsing fluid to the center of the front and back surfaces of the substrate 201. It has been found that 400 rpm provides optimal rinsing of a vertically oriented substrate, as additional energy is required to overcome the force of gravity. That is, at substrate rotation speeds of 400 rpm or more, rinsing fluid may travel upward from the substrate's center, to the upper edge of the substrate. After the substrate 201 is sufficiently rinsed (e.g., approximately 12 sec.), the rinsing fluid nozzles 208a, 208b shut off, the optional heat lamp 115 turns on, a flow of nitrogen is introduced to the surface of the substrate 201 via the tube 701, and the motor 207 increases the rotational speed of the flywheel 205 (e.g., to approximately 1000 to 2500 rpm) such that rinsing fluid is displaced from the substrate 201 via the increased rotational speed, and/or dried from the substrate 201 via the heat lamp 115 and/or the nitrogen flow.

During both the rinsing and drying steps, rinsing fluid is flung from the substrate 201 to the substrate facing surfaces of the shield system. The majority of the fluid is received by the main shield 213, however, fluid may also land on the lower shield 215, the higher shield 217, the lower unshielded portions of the housing, or may condense on the top 103c of the SRD housing 103.

In its preferred embodiment, the main shield 213 is angled such that fluid which impacts the main shield 213 is at least partially reflected therefrom toward the front side 103a of the SRD housing and therefore does not collect on the main shield 213 forming droplets which may fall on the substrate 201 positioned therebelow. Further, the shields 213, 215 and 217 are preferably hydrophilic, so that fluid which is not reflected therefrom travels therealong in a sheet, rather than forming droplets which may fall onto the substrate 201.

Fluid flows from the substrate facing surface of the higher shield 217 to the top/non-substrate-facing surface of the main shield 213. Fluid travels from the non-substrate-facing surface of the main shield 213 to the non-substrate-facing surface of the lower shield 215, and from the non-substrate-facing surface of the lower shield 215 to the backside 103b of the SRD housing 103. The rinsing fluid flows along the backside 103b of the SRD housing 103 to the bottom of the SRD housing 103f where fluid is removed by the pump (not shown).

Similarly, fluid flows from the substrate-facing surface of the main shield 213 to the non-substrate-facing surface of the lower shield 215. Due to the preferred steep angle of the lower shield 215, any fluid that lands on either the substrate facing surface or the non-substrate-facing surface of the lower shield 215 flows quickly to the backside 103b of the SRD housing. Any fluid which reaches the top 103c of the SRD housing will tend to flow therealong (due to the slope of the housing's top) to the housing's second sidewall 103e. Preferably the housing's top 103c is also hydrophilic. However, if fluid droplets form on the top 103c of the SRD housing they will fall onto the non-substrate-facing surfaces of the shield system and travel therealong, rather than contacting the substrate 201.

As the substrate 201 rotates, fluid flows along the surface of the substrate 201, rinsing residue therefrom. Some of the fluid enters the end effectors 407 of the plurality of grippers. However, within the end effectors 407, fluid flows along the smooth, radial and preferably hydrophilic surfaces of the tip region 411a, 411b, and therefore is easily displaced therefrom by rotational force as the flywheel and the substrate 201 rotate. Any fluid which reaches the point where the tip regions 411a, 411b join, may also flow therefrom via the hole 413. Accordingly, the entire surface of the substrate 201 is dried, even those regions in contact with the plurality of grippers 403a–c, 405a–b.

To further aid in drying of the substrate 201, and to encourage the flow of fluid along the shield system toward the backside 103b of the SRD housing 103, the plenum 107 is maintained at a lower pressure (e.g., 2 inches of water) than the environment within and surrounding the SRD 101 (e.g., approximately atmospheric pressure). Accordingly, a laminar air flow is drawn in through the vents 105a–d across the surface of the substrate 201 and into the plenum 107 via openings in the backside 103b of the SRD housing. This air flow aids in substrate drying, and due to the close vertical spacing of the shields 213, 215 and 217, tends to blow fluid along the surfaces thereof, toward the backside 103b of the SRD housing 103.

After the substrate 201 is sufficiently dry (e.g., after the heat lamp 115 and the nitrogen flow have been on for approximately 5 to 20 seconds), the motor 207 slows the rotation of the flywheel 205 to approximately 5 rpm so that the proximity sensor 209 positioned on the backside 103b of the SRD housing can detect the flag 211 when the flag 211 is in front of the proximity sensor 209. When the flag 211 is detected by the proximity sensor 209, the proximity sensor 209 signals the motor 207 to stop. Accordingly, the flywheel 205 stops rotating when the flywheel 205 and the substrate 201 are in a known position. Specifically, the substrate 201 is in the position it was in when placed in the SRD 101. The substrate 201 ideally is oriented prior to entry to the SRD 101.

In this known position, the base portion 601a, 601b of the moveable grippers 405a, 405b are positioned in front of the pins 603a, 603b and the pneumatic actuator (not shown) drives the pins 603a, 603b forward to contact the base portions 601a, 601b of the moveable grippers 405a, 405b and thus to open the moveable grippers 405a, 405b. The door 113 slides open and a substrate handler (not shown) extracts the rinsed and dried substrate 201.

The foregoing description discloses only the preferred embodiments of the invention, modifications of the above disclosed apparatus and method which fall within the scope of the invention will be readily apparent to those of ordinary skill in the art. For instance, the shield system may comprise one or any number of shields which may be hydrophilic, designed to reflect fluid, to direct airflow to the substrate, and/or closely spaced vertically to encourage fluid flow therealong (in the presence of laminar air flow). The shield system may be angled so as to direct fluid to the frontside, or to the first or second sidewalls of the SRD housing. The shield's substrate facing and non-substrate facing surfaces need not be parallel. Additionally, the shield system is described as having cone shaped shields which slant from a larger diameter to a smaller diameter. This configuration achieves desired fluid flow along the top of the shield system, and also directs air flow toward the main surface of the substrate to aid in drying thereof. It will be understood that the upper portion of the shield may assume other vertically and/or horizontally staggered configurations so as to achieve the desired fluid flow. Likewise, if airflow to the substrate is desired, it may be achieved with other shield or side wall configurations. Further benefits may be achieved by providing ribs (extending in the direction of, e.g. perpendicularly to, the sidewalls) along the non substrate facing surface of the shield. Finally, although the inventive shield system is preferably used for single substrate drying, aspects of the invention are equally advantageous for multiple substrate batches. The specific flag/sensor employed for substrate orientation may vary. The inert gas drying mechanism, and the mechanism for inducing pressure variations to facilitate drying may vary, as may the number of grippers and the specific configuration of grippers. The inventive principal of biasing the moveable grippers in a normally closed position, and of separating the opening actuators from the rotating grippers may be achieved via a number of configurations and yet remain within the scope of the present invention. In fact, any number of inventive aspects of the inventive SRD can be employed alone or in combination; the shield or shields, the inert gas drying mechanism, the grippers, the end effectors, the eccentric positioning, the preferred RPM rinse, the substrate orienter, etc. In fact, many of these inventive aspects are applicable to substrate spinners generally, and need not be limited to use on the SRD disclosed (e.g., the eccentric positioning, the gripper design, the substrate orienter) or may be employed within either a spin-rinser or a spin-drier. Thus, as used herein spinners include spin-rinsers and SRD's and spin-rinsers include apparatuses which spin and rinse, and which may or may not include drying (SRD's). Naturally, aside from the inventive fluid flow aspects, (e.g., the preferred RPM rinse, and the shield design for fluid flow) the remaining inventions are applicable to spinners, spin rinsers or SRD's of any orientation (horizontal, etc.). The shields are equally applicable for directing air flow regardless of substrate orientation (e.g., horizontal, vertical, etc.).

Accordingly, while the present invention has been disclosed in connection with the preferred embodiments thereof, it should be understood that other embodiments may fall within the spirit and scope of the invention, as defined by the following claims.

The invention claimed is:

1. A method of spinning, rinsing and drying a substrate comprising:
   rotating a vertically oriented substrate;
   spraying fluid on the rotating substrate; and
   at least partially sheeting fluid along an inclined hydrophilic surface of one of a plurality of shields above the substrate to a position which is not above the substrate.

2. The method of claim 1 further comprising transferring fluid from a substrate facing surface of a first shield positioned above the substrate, to a non-substrate facing surface of a second shield.

3. The method of claim 2 further comprising directing air toward the substrate via the first and second shield.

4. A method of spinning, rinsing and drying a substrate comprising:
   rotating a vertically oriented substrate;
   spraying fluid on the rotating substrate;
   at least partially reflecting fluid away from the substrate when the fluid is displaced from the substrate to a surface above the substrate; and
   at least partially sheeting fluid along an inclined hydrophilic surface of one of a plurality of shields above the substrate to a position which is not above the substrate.

5. A method of spinning, rinsing and drying a substrate comprising:
   rotating a vertically oriented substrate;
   spraying fluid on the rotating substrate;
   at least partially reflecting fluid away from the substrate when the fluid is displaced from the substrate to a surface above the substrate;
   transferring fluid from a substrate facing surface of a first shield above the substrate, to a non-substrate-facing surface of a second shield; and
   directing air toward the substrate via the first and second shield.

6. A method of spinning, rinsing and drying a substrate comprising:
   rotating a vertically oriented substrate within a vertical plane;
   spraying fluid on the rotating substrate; and
   at least partially reflecting fluid off of a surface above the substrate in a direction away from the vertical plane and away from the substrate when the fluid is displaced from the substrate to the surface above the substrate.

7. The method of claim 6, wherein at least one of a plurality of shields is used in at least partially reflecting the fluid.

8. The method of claim 7, wherein at least one of the plurality of shields is hydrophilic.

9. A method of spinning, rinsing and drying a substrate comprising:
   rotating a vertically oriented substrate within a vertical plane;
   spraying fluid on the rotating substrate;
   at least partially reflecting fluid in a direction away from the vertical plane and away from the substrate when the fluid is displaced from the substrate to a surface above the substrate; and
   at least partially sheeting fluid along an inclined hydrophilic surface of one of a plurality of shields above the substrate to a position which is not above the substrate.

10. A method of spinning, rinsing and drying a substrate comprising:
    rotating a vertically oriented substrate within a vertical plane;
    spraying fluid on the rotating substrate;
    at least partially reflecting fluid in a direction away from the vertical plane and away from the substrate when the fluid is displaced from the substrate to a surface above the substrate;
    transferring fluid from a substrate facing surface of a first shield above the substrate, to a non-substrate-facing surface of a second shield; and
    directing air toward the substrate via the first and second shield.

11. A method of spinning, rinsing and drying a substrate comprising:
    rotating a vertically oriented substrate;
    spraying fluid on the rotating substrate;
    at least partially sheeting fluid along a hydrophilic surface above the substrate to a position which is not above the substrate;
    transferring fluid from a substrate facing surface of a first shield positioned above the substrate, to a non-substrate facing surface of a second shield; and
    directing air toward the substrate via the first and second shield.

12. A method of spinning, rinsing and drying a substrate comprising:
    rotating a vertically oriented substrate;
    spraying fluid on the rotating substrate;
    at least partially reflecting fluid away from the substrate when the fluid is displaced from the substrate to a surface above the substrate, wherein the fluid is reflected by a reflecting system having a first reflecting surface and a second reflecting surface;
    transferring fluid from a substrate facing surface of a first shield above the substrate, to a non-substrate-facing surface of a second shield; and directing air toward the substrate via the first and second shield.

13. A method of spinning, rinsing and drying a substrate comprising:
rotating a vertically oriented substrate;
spraying fluid on the rotating substrate;
at least partially sheeting fluid along a hydrophilic surface of one of a plurality of shields above the substrate to a position which is not above the substrate;
transferring fluid from a substrate facing surface of a first shield positioned above the substrate, to a non-substrate facing surface of a second shield; and
directing air toward the substrate via the first and second shield.

14. A method of spinning, rinsing and drying a substrate comprising:
rotating a vertically oriented substrate;
spraying fluid on the rotating substrate;
flowing fluid away from a region above the substrate via a plurality of shields such that the fluid travels along the plurality of shields; and
directing air toward the substrate via the plurality of shields.

15. A method of spinning, rinsing and drying a substrate comprising:
rotating a vertically oriented substrate;
spraying fluid on the rotating substrate;
directing air toward the substrate via a shield system, wherein the shield system has a plurality of shielding surfaces each having a different reflective surface;
wherein directing air toward the substrate comprises directing air toward the substrate via a plurality of shields that extend at least partially along a circumference of the substrate and are angled so as to direct air toward the substrate.

16. A method of spinning, rinsing and drying a substrate comprising:
rotating a vertically oriented substrate;
spraying fluid on the rotating substrate;
at least partially sheeting fluid along a hydrophilic surface of one of a plurality of shields above the substrate to a position which is not above the substrate; and
transferring fluid from a substrate facing surface of a first shield positioned above the substrate, to a non-substrate facing surface of a second shield.

17. A method of spinning, rinsing and drying a substrate comprising:
rotating a vertically oriented substrate;
spraying fluid on the rotating substrate;
at least partially sheeting fluid along a hydrophilic surface of one of a plurality of shields above the substrate to a position which is not above the substrate;
transferring fluid from a substrate facing surface of a first shield positioned above the substrate, to a non-substrate facing surface of a second shield; and
directing air toward the substrate via the first and second shield.

* * * * *